United States Patent [19]

Risinger

[11] Patent Number: 4,460,952

[45] Date of Patent: Jul. 17, 1984

[54] ELECTRONIC RECTIFIER/MULTIPLIER/LEVEL SHIFTER

[75] Inventor: Vance Risinger, Lubbock, Tex.

[73] Assignee: Texas Instruments Incorporated, Dallas, Tex.

[21] Appl. No.: 377,729

[22] Filed: May 13, 1982

[51] Int. Cl.³ .................... H02M 7/08; H02M 7/10
[52] U.S. Cl. .................................... 363/61; 307/110; 363/60
[58] Field of Search ................ 307/110; 363/59–61, 363/62, 127

[56] References Cited

U.S. PATENT DOCUMENTS

| | | | |
|---|---|---|---|
| 3,731,179 | 5/1973 | Rademaker | 363/60 |
| 4,321,661 | 12/1982 | Sano | 363/60 |
| 4,340,931 | 7/1982 | Endo et al. | 363/124 |
| 4,398,099 | 8/1983 | Benoit-Gonin | 363/60 |

FOREIGN PATENT DOCUMENTS 3115 1/1977 Japan .................................. 307/110

OTHER PUBLICATIONS

Accardi, "Diode-Switched FET's Rectify the Full Wave," Electronics, Aug. 3, 1970.

Primary Examiner—William H. Beha, Jr.
Attorney, Agent, or Firm—William E. Hiller; James T. Comfort; Melvin Sharp

[57] ABSTRACT

A rectifier/multiplier/level shifter utilizing multiple capacitors which are switched from parallel to series or vice versa. An analog signal is communicated to a plurality of capacitors in parallel which are subsequently connected in series by selective switching. Depending upon the sign of the analog signal, taps are made on the capacitors so as to rectify the incoming analog signal. In a similar fashion a tap utilizes the serial multiplication of the capacitors so as to create a multiplier circuit. This particular architecture is particularly well suited for a metal-oxide-silicon (MOS) embodiment.

7 Claims, 3 Drawing Figures

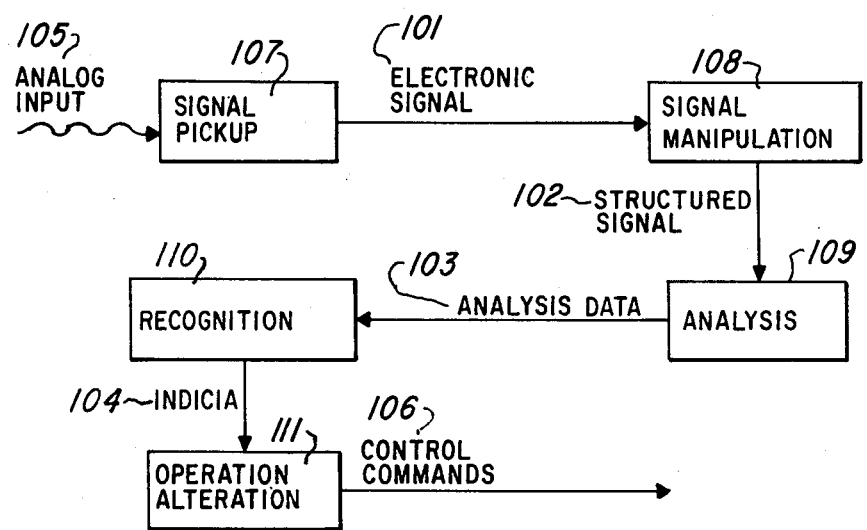
Fig. 1
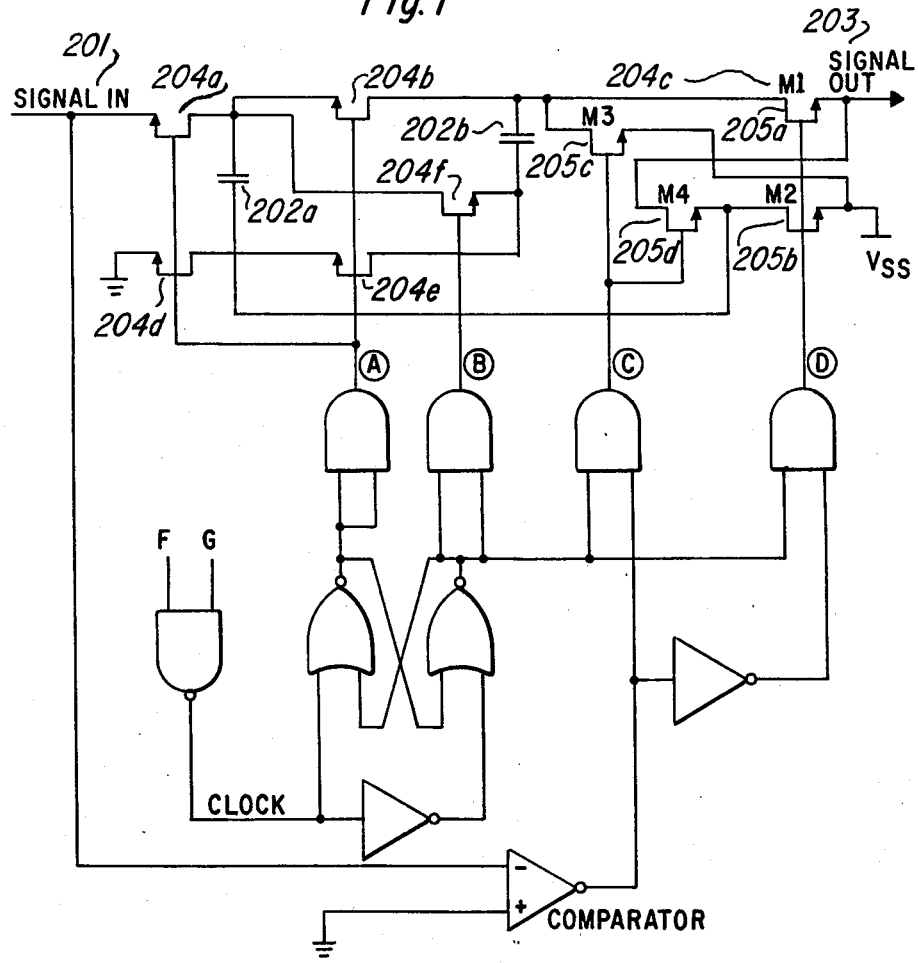

ELECTRONIC RECTIFIER/MULTIPLIER/LEVEL SHIFTER

BACKGROUND

This invention relates to rectifiers or multipliers and more particularly to semiconductor rectifiers and multipliers.

The need to rectify input signals has long existed in the art. Generally the rectification of a signal is accomplished through the use of diodes and rectifier tubes. As discrete devices though, diodes and rectifier tubes require a minimum threshold before they allow the current to pass. This threshold level causes a clipping action which is highly undesirable in many circuits.

Analog signal multiplication is typically performed through the use of amplifiers. This operation as well requires a threshold voltage; therefore, low voltages are not multiplied whatsoever.

Little or no analog signal multiplication or rectification is done through an integrated circuit. This is due to the limitation on presently used rectification methods which prevent them from being amenable to integration.

SUMMARY OF THE INVENTION

The present invention utilizes a capacitor means which is coupled to an incoming analog signal and additionally to ground. A switching means connects either the first or the second node of the capacitor means to the output depending upon the polarity of the incoming analog signal. In this fashion the incoming analog signal is rectified.

Additionally the present invention encompasses the architecture wherein the capacitor means contains a plurality of individual capacitors which are selectively coupled in parallel or in series so as to multiply the incoming analog signal accordingly.

The plurality of capacitors being selectively coupled either in parallel or in series is also advantageous because the capacitors when coupled in parallel may sample the incoming analog signal as referenced to one reference voltage and when switched to the output as series-connected capacitors may be referenced to another reference voltage, thereby allowing the incoming analog signal to be level shifted.

In the preferred embodiment of the invention two capacitors are used which are switchable from parallel to series interconnection. The incoming analog signal, in the rectification operation is communicated to both capacitors being in parallel while the second node of the capacitors is connected to ground. The capacitors are then switched to series, being disconnected from the incoming analog signal, and either the first node of the series or the second node of the series is communicated as the rectified output signal depending upon the sign of the input analog signal. The decision as to the sign of the input analog signal is done by way of a comparator connected to ground which activates the appropriate switches.

In this fashion the input analog signal is multiplied (doubled) and rectified by the circuitry. This particular architecture is compatible with semiconductor implementation and particularly compatible with metal-oxide-silicon (MOS) applications.

The invention is further explained by the following description and its applicability.

DESCRIPTION

In general the recognition of an analog or spoken signal entails the translation of the spoken signal into an electronic signal. This is typically done by way of a microphone or other such signal pick up device. This electronic signal is manipulated to be in the proper format for later use. The formatted signal is analyzed so as to develop appropriate data therefrom. This analysis data is used to determine or recognize which word or phrase has been spoken in the original analog input. The recognized word or phrase has an identifying indicia associated therewith which is used for storage, later reference, or control of an apparatus.

In this context the alteration or change of an operation is as simple as communicating the indicia to an operator or as complex as the control of some other electronic apparatus.

Formatting:

The electronic signal from the microphone or other such pick up means is manipulated so that it is either rectified, multiplied or otherwise structured so as to place it in a better condition for the analysis. This formatting of the electronic signal speeds up the entire operation significantly.

Rectification of the signal is particularly important so as to allow reduced circuitry. In the preferred embodiment of rectification, the incoming signal is communicated to a plurality of capacitors. A sensing means, connected to ground, activates switches so as to tap the node of the capacitors which rectifies the incoming signal.

Multiplication is effected in the same circuitry by selectively connecting the capacitors in series (thereby multiplying the signal) or parallel (dividing the signal).

This switching operation maintains the signal between two bounds for ease in operating thereon.

The circuitry above is readily implementable on a semiconductor unit such as a metal-oxide-silicon (MOS) device.

Analysis:

The preferred analysis operation passes the formatted electronic signal through an automatic gain control circuit (AGC) then through a low pass filter. In this context, it has been found that a low pass filter of 500 hertz (Hz) is suitable for this operation. The automatic gain control is used as an interface with the analog signal from the microphone. The AGC provides a more or less constant peak output level having a sufficient amplitude so as to drive the low pass filter and other components thereafter.

In this context, it has been found that an AGC having a peak signal level less than 80% of the full voltage and greater than 40% of full voltage provides satisfactory results. Additionally, a total 54 dB of gain reduction and a potential of better than 80 dB total gain is also desirable.

The low pass filter is used to roll off the high frequency components of the signal. The filter preferably provides an anti-aliasing for a signal so that no high frequency component of the signal overpowers the system sample rate of preferably 8 kHz so as to produce an interference signal. Preferably the cutoff frequency is 3.4 kHz.

The signal from the low pass filter is communicated to a pre-emphasis circuit so as to help eliminate any glottal waveform and lip radiation which may be included within the speech. It has been found that the glottal waveform and lip radiation components of speech interfere dramatically with the vocal tract estimation when using linear predictive coding (LPC) analysis. In this context, it has been found that a pre-emphasis transformation of the formula: $S(n)-uS(n-1)$, where $S(n)$ is the sample at time N and where preferably $0.9 \leq u \leq 1.0$ performs suitably. This equation is preferably performed in an analog sample data domain.

The calculation of the autocorrelation terms in LPC analysis requires the computation of numerous multiplications and additions. So as to reduce the time necessary for these computations, a logarithmic analog to digital (Log A/D) converter is utilized which translates the analog signal from the pre-emphasis into its logarithmic digital equivalent. This allows the logarithmic digital equivalent sequence to be selectively added to other logarithmic digital equivalents so as to effectively perform a "logarithmic multiplication". The logarithmic multiplication product is thereafter transformed into its linear equivalent and selectively accumulated with other linear equivalents. In this fashion, the need to perform multiplications upon digital values in completely eliminated since only addition operations are necessary. This elimination of multiplication operations significantly accelerates the entire process allowing for "real time" operation.

The selective accumulation of the products generates autocorrelation terms which are utilized by the Le-Roux/Gueguen equations so as to develop reflection coefficients which are usable in an LPC synthesizer. The reflection coefficients are formatted and coded appropriately and then stored in a memory for later retrieval.

It is important to note that the reflection coefficients are particularly well suited for recognition and/or synthesis. Since they are already in proper format for synthesis, they are readily usable for matching to template data to determine the word, phrase, sentence, allophone, or sound.

Matching:

The preferred apparatus for matching the reflection coefficients derived from the spoken speech to template data involves dynamic programming which time warps the input to the template. Time warping is necessary since the same word takes a varying amount of time to be spoken by different people as well as by the same person. Time warping allows one frame of input to correspond to varying amounts of times within reference frames of the template.

For example, assume that N templates exist; that is, N words or phrases are independently recognizable. If template j has 50 frames associated therewith and each frame takes 25 milliseconds, then the speech input which takes 75 frames should not necessarily be discarded. A particular frame within the input is mapped to varying numbers of frames with the template.

In the computation, the minimal contour to a target frame of a particular template is determined. In this apparatus, only the past four columns of minimal distance or path data are kept. The preferred embodiment utilizes LPC-4 (linear predictive coding having a filter order of 4). The Euclidean distance between the input frame and each target frame of the template is computed. This generates, for time t, a distance column which is dynamically mapped to the minimal matrix for time, t-1, t-2, t-3 and t-4. The minimal value between each value within the distance column and a prior minimum of the minimum matrix is derived. This generates a minimum column. The minimum column replaces the oldest column within the minimum matrix.

Generally, this technique maps the minimum contour for a particular input frame being associated with a particular target frame within the template.

When the end of word is determined, whether by operator input or by sensing the amplitude of the speech, the most current upper value having the minimal value of all templates is chosen. The template associated therewith is the "best" match for the spoken word. The basic premise is to determine with which template does a sequence of input frames most closely align itself. The width of a frame is "warped" to allow an input frame to be associated with half, one, two, three, etc target frames.

In this manner the optimal match between the spoken word or phrase is made. The computation of the minimal value is performed continuously and only when the end of word or phrase is given is the minimal value of the templates determinative of the word having been spoken.

Recognition:

The preferred recognition apparatus utilizes a microphone with the LPC analysis already described together with the control means. The control means accepts the reflection coefficients developed through the analysis and compares these with template data. An indicia of the recognized template is communicated so as to communicate the word associated therewith.

Two semiconductors units are therefore all that is necessary so as to create a recognition device. Optionally, a read-only-memory (ROM) or other such memory device is usable for expansion of the vocabulary repertoire. An expansion of the template library is placed on the ROM.

Since two semiconductor units are all that is necessary, it is practical to make the recognition apparatus as a portable hand held device. Battery power, solar energy or other such means for portable power supply allows the device to be readily moved to remote areas for privacy or for a specific application.

This arrangement allows for the creation of a learning aid which accepts spoken words as well as tactile input data.

The following drawings with their accompanying descriptions and discussion more fully describe the present invention, its embodiment, and ramifications thereupon.

DRAWINGS IN BRIEF

FIG. 1 is a block diagram of a recognition apparatus.

FIG. 2 is an electrical schematic of the rectifier/multiplier electronic circuit device in accordance with the present invention.

DRAWINGS IN DETAIL

Figure 3:
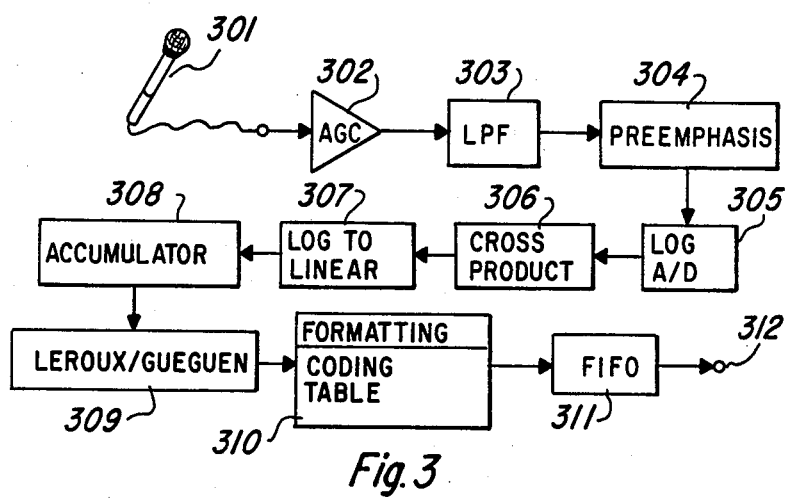
FIG. 3 is a block diagram of the preferred embodiment of the analysis apparatus.

FIG. 1 is a block diagram of an embodiment of the recognition operation. The analog input 105 from the operator is picked up by the signal pick up means 107. Signal pick up means 107 translates the analog input into an analog electronic signal 101 which is communicated to the signal manipulation means 108. The signal manipulation means 108 structures the analog electronic signal 101 into a form which is readily used by the analysis means 109. Manipulation includes rectification, multiplication, filtering, and the like.

The analysis means generates data and other indicia relative to the structured signal 102 so as to form a "fingerprint" of the original analog input 105. The analysis means 109 communicates this analysis data 103 to the recognition means 110. The recognition means 110 compares the analysis data to template data, not shown. Based upon this comparison, an indicia 104 is communicated to the operation alteration means 111 which generates control commands 106 thereupon.

In this fashion, the analog input is translated, matched to an appropriate template and is used to alter the operation of the present apparatus or some other device apparatus. This architectural arrangement allows for a spoken command to effectively control an apparatus.

FIG. 2 is a schematic of the rectifier/multiplier apparatus. The incoming signal 201 is selectively communicated to the capacitor 202. In this embodiment, two capacitors, 202a and 202b, are used which are matched as to their capacitive ability. In an alternative embodiment, multiple capacitors are used and their relative capacitance is varied selectively so as to provide more flexibility in signal manipulation.

Upon the input of the signal, the switch arrangement 204a and 204f is interconnected so that the incoming signal is communicated in parallel to both capacitors 202a and 202b. At the appropriate clocking pulse, capacitors 202a and 202b are switched to a serial arrangement so as to double the original incoming signal 201. This signal, through the use of the switch arrangement 205a–205d rectifies the signal to be of a particular polarity.

This arrangement is particularly adaptable to being placed upon a semiconductor device. Additionally, the architecture provides easy multiplication and rectification without the loss due to clipping or other inadequacies found in the prior art.

FIG. 3 is a block diagram of an embodiment of the analysis circuit. Microphone 301 receives the spoken analog signal which is communicated to an automatic gain control (AGC) 302.

The AGC 302 is used as an analog interface for the microphone 301. The AGC 302 provides a relatively constant peek output level having a sufficient amplitude so as to drive the low pass filter 303, the pre-emphasis 304, and the logarithmic analog to digital (Log A/D) 305. The AGC 302 in providing this peak output level, allows for low level input signals to be effectively utilized and thereby reduces clipping.

In this capacity it has been found that an AGC providing a peak signal of less than 80% of voltage rail and greater than 40% of the voltage rail is suitable. Additionally it has been found that a gain being incremented in six (6) dB steps is acceptable.

The signal from the AGC 302 is communicated to the low pass filter 303 which is used to withdraw high frequency components of the signal. The low pass filter 303 also gives an anti-aliasing of the signal so that a high component of the signal is not able to overpower the system sample rate of preferably 8 KHz. This significantly reduces the interference signal normally found in speech.

The signal from the low pass filter 303 is communicated to pre-emphasis 304. The pre-emphasis 304 is used to eliminate the glottal waveform and lip radiation components of speech. These components typically interfere with vocal tract estimation and therefore the pre-emphasis 304 provides for a more accurate linear predictive coding (LPC) analysis. The use of the pre-emphasis 304 eliminates the variable frequency through a simple one pole differencing filter. In this context it has been found that a pre-emphasis being defined by the function:

$$\text{output} = S(n) - uS(n-1),$$

where $S(n)$ is the sample at time n is acceptable.

The signal from the pre-emphasis 304 is communicated to the Log A/D 305 which translates the heretofore analog signal into its logarithmic digital equivalent. The translation to the logarithmic form allows for elimination of multiplication since logarithmic components, through their addition, effectively perform a multiplication.

The Log A/D 305 signal is communicated to a cross product means 306 which sums chosen elements from the Log A/D 305. These chosen sums are then translated to their linear equivalents 307 and subsequently accumulated selectively by an accumulator 308. In this process, the accumulator 308 generates reflection coefficients which are usable by the LeRoux/Gueguen formula 309 for the generation of autocorrelation terms.

The autocorrelation terms are preferably formatted/encoded so as to be usable in a speech synthesis device. The autocorrelation terms so formatted are stored in a memory 311 in a first-in-first-out (FIFO) arrangement so that they are retrievable upon demand at 312.

In this manner, the incoming signal is controlled and generates analysis data which is usable for recognition and/or synthesis of a mimic word.

What is claimed is:

1. An electronic circuit device for providing multiplication and rectification of an analog signal, said circuit device comprising:

an input for receiving the analog signal;

plural capacitor means operably coupled to said input and including at least first and second capacitors arranged to be alternatively coupled in parallel relationship in a first phase and in series relationship in a second phase;

a first switching network operably connected to said plural capacitor means and having first and second switching relationships with respect to said at least first and second capacitors interconnecting said at least first and second capacitors in parallel relationship and in series relationship respectively;

control means operably connected to said first switching network for determining the switching relationship of said first switching network with respect to said at least first and second capacitors;

said first switching network initially being in said first switching relationship interconnecting said at least first and second capacitors in parallel relationship for reception of the analog signal from said input and being responsive to said control means for switching to said second switching relationship interconnecting said at least first and second capacitors in series relationship such that the original analog signal is multiplied; and a second switching network operably connected to the output of said plural capacitor means and having first and second switching relationships with respect to said at least first and second capacitors depending upon the polarity of the analog signal received at said input for selectively providing as the output signal, the signal from one of said capacitors such that the output signal is rectified to be of a particular polarity.

2. An electronic circuit device as set forth in claim 1, further including comparator means coupled to said input and to a source providing a reference voltage for comparing the analog signal from said input with the reference voltage to derive a polarity indication of said analog signal; and the output of said comparator means being operably coupled to said second switching network to communicate the polarity of said analog signal thereto.

3. An electronic circuit device as set forth in claim 1, wherein said control means comprises a timing clock for providing clocking pulses at predetermined time intervals to said first switching network to which said first switching network is responsive in switching between said first and second switching relationships.

4. An electronic circuit device as set forth in claim 3, wherein said first switching network comprises a plurality of MOS transistors operating in a switching mode.

5. An electronic circuit device as set forth in claim 4, wherein said second switching network comprises a second plurality of MOS transistors operating in a switching mode.

6. An electronic circuit device as set forth in claim 5, wherein said electronic circuit device has a single semiconductor substrate on which said plural capacitor means and said MOS transistors included in said first and second switching networks are integrated.

7. An electronic circuit device as set forth in claim 1, wherein said at least first and second capacitors as coupled in parallel relationship in said first phase are referenced to a first reference voltage; and said at least first and second capacitors as coupled in series relationship in said second phase are referenced to a second reference voltage different from said first reference voltage such that level shifting of the original analog signal occurs.

* * * * *